(12) United States Patent
Fujiwara et al.

(10) Patent No.: US 6,415,416 B1
(45) Date of Patent: Jul. 2, 2002

(54) METHOD FOR IMPROVING THE EFFICIENCY OF DESIGNING A SYSTEM-ON-CHIP INTEGRATED CIRCUIT DEVICE

(75) Inventors: Makoto Fujiwara, Kyoto; Akira Motohara, Hyogo; Toshiyuki Yokoyama, Kyoto, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/418,312

(22) Filed: Oct. 14, 1999

(30) Foreign Application Priority Data

Oct. 16, 1998 (JP) .......................................... 10-294969

(51) Int. Cl.⁷ ............................................. G06F 17/50
(52) U.S. Cl. .................................................... 716/2
(58) Field of Search .................................... 716/1, 2, 8

(56) References Cited

U.S. PATENT DOCUMENTS 5,613,136 A * 3/1997 Casavant ..................... 716/13

FOREIGN PATENT DOCUMENTS

| JP | 05325539 | 10/1993 |
| JP | 08221371 | 8/1996 |
| JP | 10336211 | 12/1998 |

* cited by examiner

*Primary Examiner*—Matthew Smith
*Assistant Examiner*—Thuan Do
(74) *Attorney, Agent, or Firm*—McDermott, Will & Emery

(57) ABSTRACT

Information about an exclusive operation among a plurality of blocks and interconnection information about a sharable resource within each of these blocks are defined. Based on the sharable resource information and the inter-block exclusive operation information, a resource sharable among the blocks is extracted. Module specifications, in which information about interfaces, power dissipation, operation models and top-level hierarchy interconnection is stored, exclusive operation information describing an exclusive operation rule among the blocks, and prioritized function information used for preventing respective functions from being enabled at the same time are input to an generator, which is an automatic generating tool. In this manner, a power and clock management module for use in power save management, a wrapper bank select module storing interconnection information, a shared resource module storing information about a sharable resource and an optimized top-level hierarchy module storing interconnection information about an optimized top-level hierarchy are generated. Downsizing and power saving are realized by resource sharing and power management.

11 Claims, 8 Drawing Sheets

METHOD FOR IMPROVING THE EFFICIENCY OF DESIGNING A SYSTEM-ON-CHIP INTEGRATED CIRCUIT DEVICE

BACKGROUND OF THE INVENTION

The present invention generally relates to a database for use in the design of an integrated circuit device and to a design method using such a database, and more particularly relates to design technology to cope with system-on-chip implementation.

A semiconductor device for an electronic unit has been fabricated until just recently by forming individual types of LSI's such as memories and processors on respective semiconductor chips and then mounting these chips on a motherboard like a printed wiring board.

Over the past few years, however, a semiconductor device is increasingly required to reduce the overall size, weight, power dissipation and fabrication cost thereof to further broaden the industrial applicability of an electronic unit including such a device. Among other things, a consumer electronic unit for use in digital information processing has to meet all of these requirements more often than any other electronic unit. Responsive to such a demand from the electronic unit industry, the prime target of semiconductor technology is going to shift from memories to system LSI's.

Specifically, a system LSI is a single-chip implementation including memories and various types of logic circuits on a single chip. To form a system LSI, not only the technology of forming devices like transistors with dissimilar structures on a common substrate, but also the design technology thereof should be greatly innovated.

Thus, according to a suggested technique of designing a system LSI, a database is prepared in advance to design an arbitrary block consisting of a great number of cells, each implementing a required function, e.g., a so-called "functional block". By using such a database, any desired system LSI can be designed as a combination of blocks.

FIG. 8 is a block diagram schematically illustrating an arrangement of a conventional system LSI. As shown in FIG. 8, the system LSI includes four blocks 11A, 11B, 11C and 11. The blocks 11A and 11B are first and second universal asynchronous receiver-transmitter (UART1 and 2) blocks, the block 11C is a direct memory access (DMA) block and the block 11D is a timer (TIM) block. Each of these blocks 11A through 11D includes: an internal controller (labeled as "Control Logic") 12A, 12B, 12C or 12D; an interface circuit ("Host I/F") 13A, 13B, 13C or 13D; an FIFO memory ("TX-FIFO") 14A, 14B, 14C or 14D; and a clock generator ("CLKGEN") 15A, 15B, 15C or 15D. All of these block components are provided as individual cells. The system LSI actually includes a great number of blocks other than those illustrated in FIG. 8, but only these four blocks 11A through 11D are illustrated in FIG. 8 for sake of simplicity.

According to the conventional design method, a specific physical structure for performing an intended function has been defined in advance for each block. Thus, in the physical design of an overall semiconductor device, only the interconnections among the blocks and peripheral circuitry have to be newly designed. In this manner, the conventional method tries to increase the design efficiency considerably.

The conventional design technique, however, has the following drawbacks. In the structure shown in FIG. 8, the FIFO memories 14A through 14D and clock generators 15A through 15D are provided for the respective blocks 11A through 11D. However, at least one of the FIFO memories 14A through 14D might be shared at least between a pair of blocks 11A, 11B, 11C, 11D. Also, a common clock signal might be applicable to all of these blocks 11A through 11D. Even so, the data defined for these blocks still should be used as it is and none of the FIFO memories 14A through 14D and clock generators 15A through 15D is omissible according to such a design method. As a result, power is dissipated in vain, structure is unnecessarily complicated and occupied area increases for nothing in such a situation.

SUMMARY OF THE INVENTION

The present inventors noticed that the root of the problems involved with the conventional block-based design method lies in that the design of a semiconductor device as a system LSI is not managed at a higher level but at a lower functional design level. An object of the present invention is providing a semiconductor device optimized to meet various requirements imposed by the electronic industry, like downsizing and reduced power dissipation, by designing the overall device at the higher specification, architectural and RT levels, while still using the design data for respective blocks.

A first exemplary method according to the present invention is adapted to design a semiconductor integrated circuit device including a plurality of blocks. The method includes the steps of: a) defining exclusive operation information among the blocks; b) defining interconnection information about a sharable resource within each said block; and c) extracting a resource sharable among the blocks based on the information about the sharable resource and the exclusive operation information among the blocks.

According to the first method, a sharable resource can be extracted easily. Thus, physical resources required can be cut down by taking advantage of the sharable resource.

In one embodiment of the present invention, the first method preferably further includes the step of d) generating interconnection information about the resource sharable among the blocks after the step c) has been performed. In such an embodiment, a semiconductor integrated circuit can be designed by using the sharable resource smoothly.

In this particular embodiment, the first method may further include the step of defining timing information about the sharable resource within each said block before the step d) is performed. In the step d), the timing information is used. In such an embodiment, more accurate interconnection information can be generated about the shared resource.

In an alternate embodiment, the first method may further include the step of e) generating interconnection information about an optimized top-level hierarchy based on the interconnection information about the resource sharable among the blocks and interconnection information about a top-level hierarchy that has been generated in advance. In such an embodiment, the overall system performance of a semiconductor integrated circuit device can be estimated more accurately. Thus, an optimum database can be selected for each block.

In another alternate embodiment, the first method may further include, before the step d) is performed, the steps of: defining a standard interface for the sharable resource; and generating information about the standard interface for the sharable resource. In the step d), the standard interface information is used. In such an embodiment, more accurate interconnection information can be generated.

A second exemplary method according to the present invention is adapted to design a semiconductor integrated circuit device including: a plurality of blocks, each consisting of a plurality of cells; and a resource shared among the blocks. The method includes the steps of: a) defining exclusive operation information among the blocks; and b) generating a signal switching control for the resource shared among the blocks based on the exclusive operation information.

According to the second method, data can be generated using the exclusive operation information such that the shared resource can be taken advantage of smoothly among the respective blocks without mutual interaction.

In one embodiment of the present invention, the second method preferably further includes the step c) of defining interconnection information about a top-level hierarchy and then generating interconnection information about an optimized top-level hierarchy after the step b) has been performed. In such an embodiment, the overall system performance of a semiconductor integrated circuit device can be estimated more accurately. Thus, an optimum database can be selected for each block.

A third exemplary method according to the present invention is adapted to design a semiconductor integrated circuit device including a plurality of blocks, each consisting of a plurality of cells. The method includes the steps of: a) defining exclusive operation information as to each functional unit within each said block; b) defining interconnection information about a top-level hierarchy; and c) generating a power management for each said block based on the exclusive operation information and the interconnection information about the top-level hierarchy.

According to the third method, the power to be consumed by each block can be estimated efficiently at a higher level by utilizing the exclusive operation information such that the resultant power dissipation can be saved.

A fourth exemplary method according to the present invention is adapted to design a semiconductor integrated circuit device including a plurality of blocks, each consisting of a plurality of cells. The method includes the steps of: a) defining exclusive operation information among the blocks; b) defining interconnection information about a top-level hierarchy; and c) generating a power management among the blocks based on the exclusive operation information and the interconnection information about the top-level hierarchy.

According to the fourth method, power to be consumed can be estimated efficiently at a higher level such that the power dissipated by the overall semiconductor integrated circuit can be saved.

A fifth exemplary method according to the present invention is adapted to design a semiconductor integrated circuit device including a plurality of blocks, each consisting of a plurality of cells. The method includes the steps of: a) defining priority-order information as to respective functional units within each said block; b) defining interconnection information about a top-level hierarchy; c) generating priority-order-controlling information for the respective blocks based on the priority-order information as to the respective functional units within each said block and the interconnection information about the top-level hierarchy; d) defining information about allowable power; and e) generating a power management based on the priority-order-controlling information for the respective blocks such that each said cell operates within a range of the allowable power defined by the allowable power information.

According to the fifth method, power management can be performed in such a manner as to save the power dissipation as much as possible, while preventing the power consumed from exceeding the maximum allowable value thereof as a result of simultaneous enablement of a plurality of functions.

DESCRIPTION OF THE PREFERRED EMBODIMENTS

Figure 8:
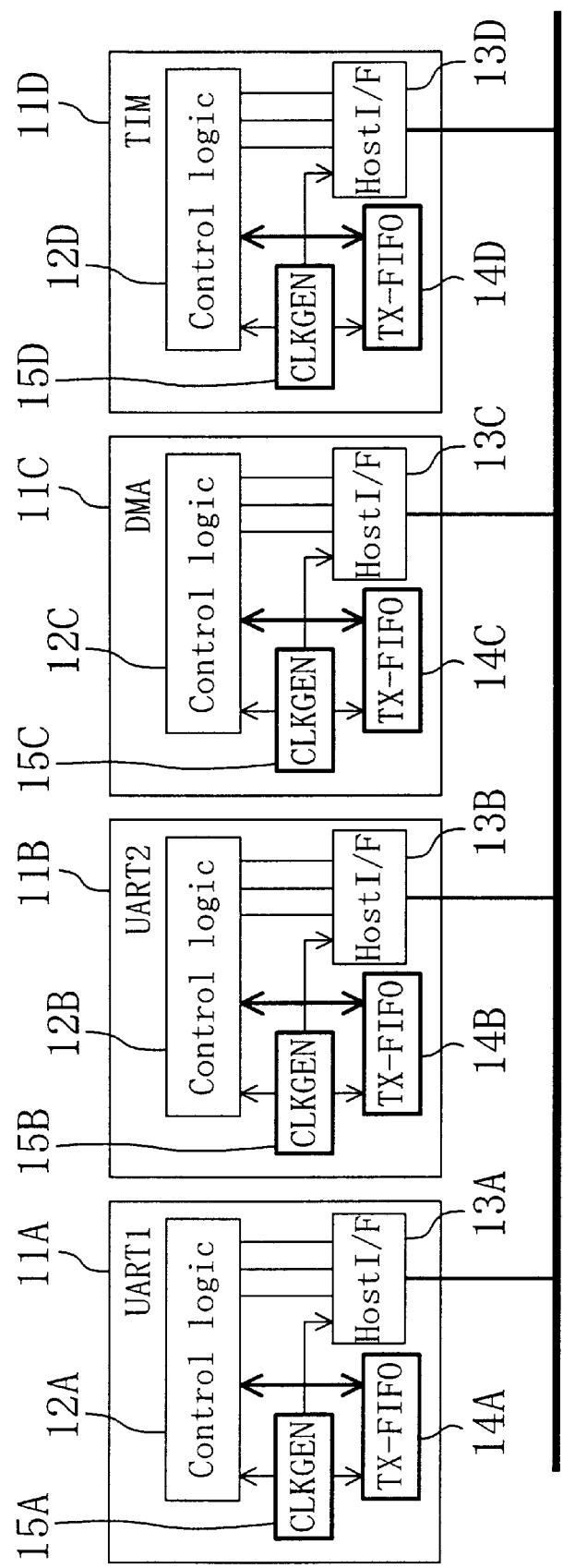
FIG. 8 is a block diagram illustrating a conventional system LSI.

In the following exemplary embodiment of the present invention, a method for designing an optimized system LSI will be described using the system LSI including the blocks 11A through 11D as shown in FIG. 8 and referred to in the description of the prior art. Specifically, a method for designing a system LSI, which includes first and second universal asynchronous receiver-transmitter (UART1 and 2) blocks 11A and 11B, a direct memory access (DMA) block 11C and a timer (TIM) block 11D, will be exemplified.

Figure 1:
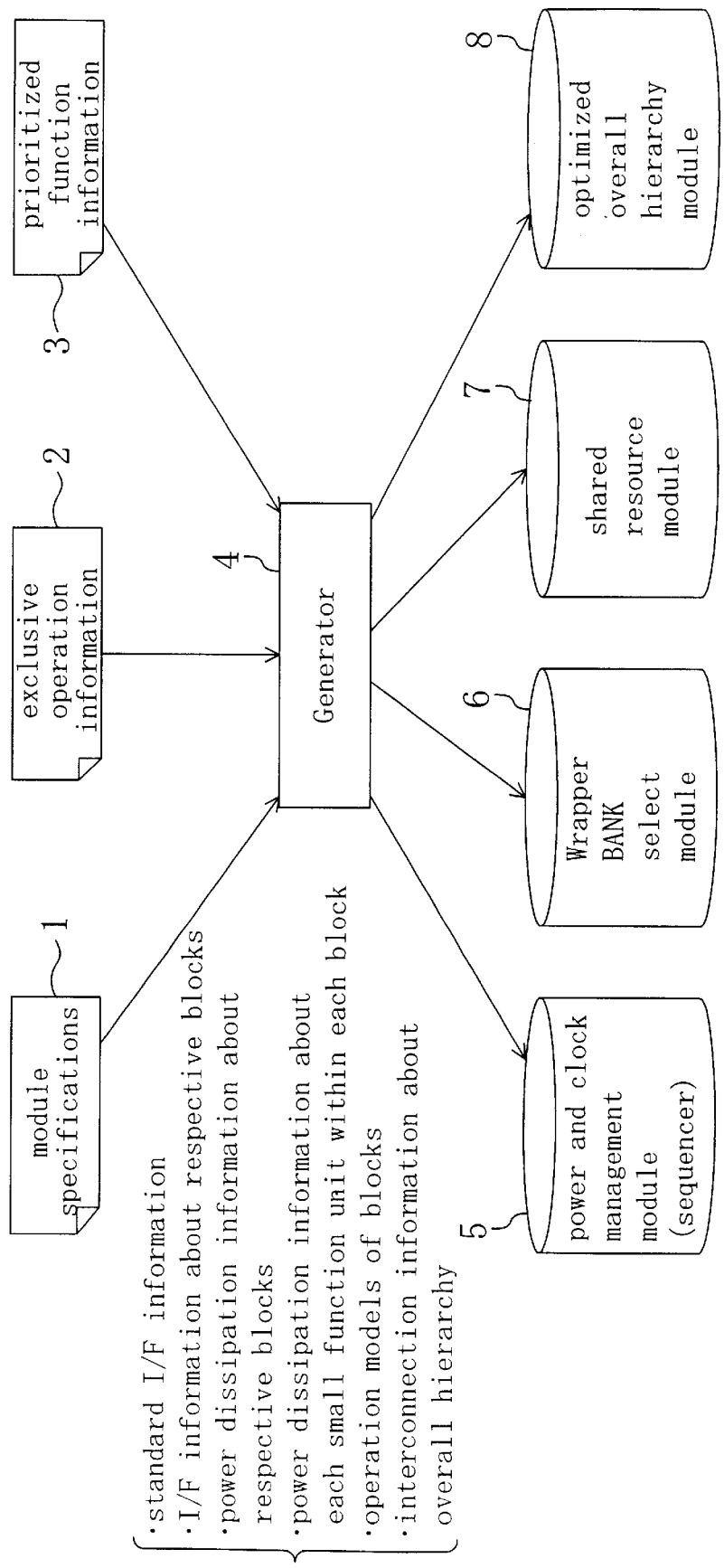
FIG. 1 is a flowchart illustrating a procedure of generating respective modules based on higher-level information and information automatically added to respective blocks according to an exemplary embodiment of the present invention.

FIG. 1 is a flowchart illustrating a procedure of generating respective modules (design data) based on higher-level information and information automatically added to respective blocks according to an exemplary embodiment of the present invention.

Examples of module specifications 1 include: information defining a standard interface; interface information about the respective blocks 11A through 11D in terms of information timing, signal meanings and pulse widths; power dissipation information about the blocks 11A through 11D; power dissipation information about each small function unit within each block; operation models (or functional models) of the blocks 11A through 11D; and interconnection information about a top-level hierarchy.

Exclusive operation information 2 contains information about an exclusive operation rule such as "the blocks 11A and 11B should not operate in parallel to each other, but the blocks 11A and 11D may" as for the example shown in FIG. 8.

Prioritized function information 3 contains information defined to perform power management as a sort of breaker function when an erroneous operation might be caused if respective functions are enabled simultaneously. Specifically, in such a situation, the prioritized function information 3 instructs the prioritized operation of a certain block by deactivating any of the blocks or by dropping a clock rate. That is to say, information defining the order of priority is stored in the storage 3 as for the operation of an overall block and the operations of respective cells included in the block.

Then, the information stored in the respective storage 1, 2 and 3 is input to a generator 4, i.e., an (automatic) generating tool, thereby generating power and clock management module (sequencer) 5, wrapper bank select module 6, shared resource module 7 and optimized top-level hierarchy module 8. The power and clock management module 5 is a database for power save management. The wrapper bank select module 6 is a database about the formation of Wrapper. The shared resource module 7 is a database about a sharable resource. And the optimized top-level hierarchy module 8 is a database of interconnection information about an optimized top-level hierarchy.

Figure 2:
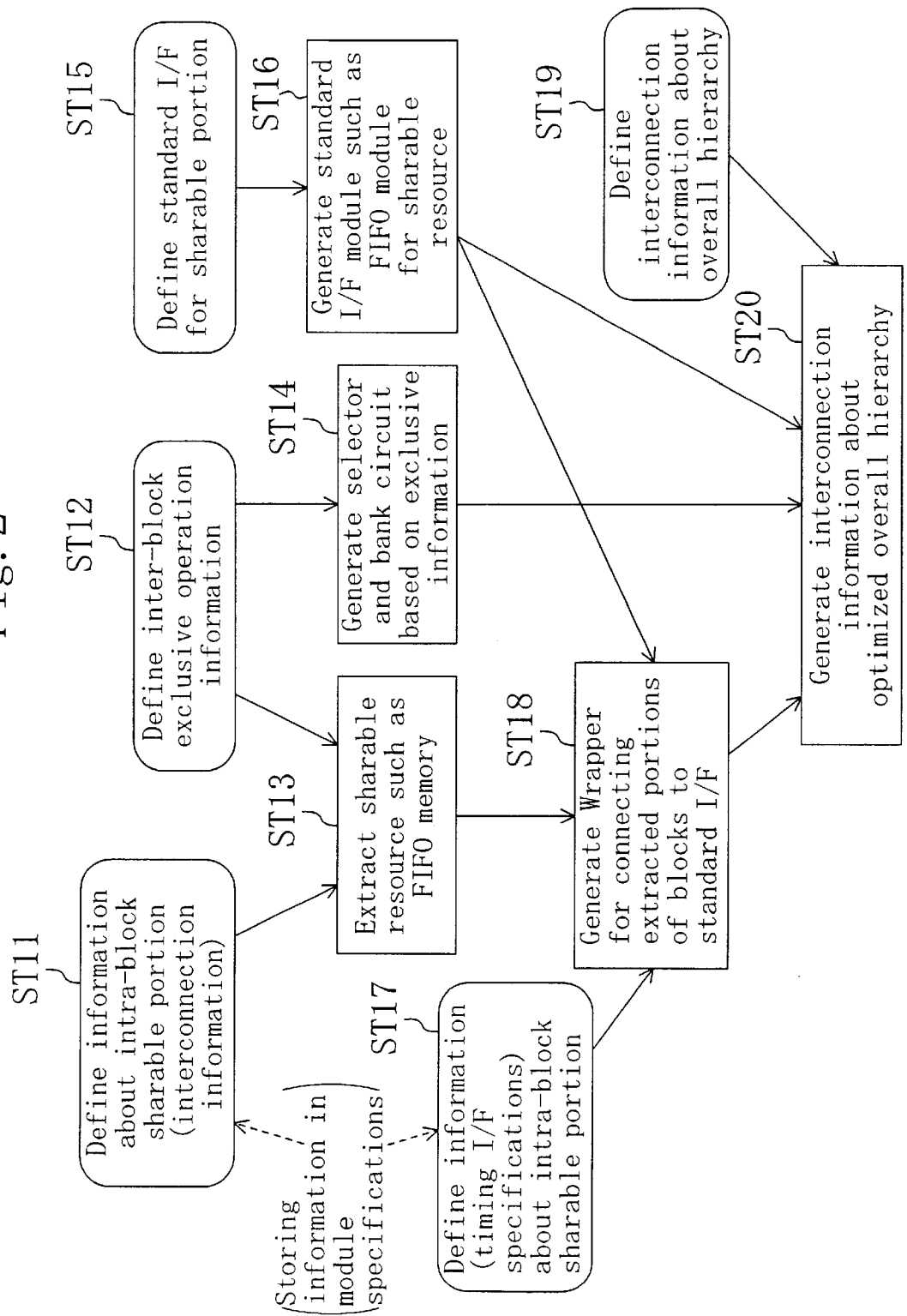
FIG. 2 is a flowchart illustrating a procedure of generating interconnection information about an optimized top-level hierarchy using the information about a sharable resource according to the embodiment.

FIG. 2 is a flowchart illustrating a procedure of generating interconnection information about an optimized top-level hierarchy using the information about a sharable resource.

In Step ST11, information about a sharable portion within each of the blocks 11A through 11D, i.e., interconnection information about an intra-block sharable portion, is defined and stored in the module specifications 1 shown in FIG. 1. Examples of the sharable portions include the FIFO memories 14A through 14D shown in FIG. 8. Information about the type of interface and function of the sharable portion within each block is stored in the module specifications 1. In this specification, to "define" may be manual input operation, extraction from a state transition table using a state machine or automatic generation from other information source.

In Step ST12, information about an exclusive operation among the blocks (inter-block exclusive operation information) is defined. Then, in Step ST13, a sharable resource (e.g., an FIFO memory) is extracted based on the information defined in these Steps ST11 and ST12. In this case, sections not operating exclusively, i.e., sections operating in parallel among the blocks, cannot be shared as a matter of principle. In the illustrated example, the FIFO memories 14A through 14C of the blocks 11A through 11C are supposed to be sharable, but the FIFO memory 14D of the block 11D is supposed to be non-sharable because the memory 14D is operating continuously. The clock generators 15A through 15D are also supposed to be sharable resources.

In Step ST14, a selector and bank circuit is generated based on the information defined in Step ST13. The selector and bank circuit is provided to switch the banks (or areas) of a memory as will be described later.

On the other hand, a standard interface is defined for the sharable portion in Step ST15. Then, in Step ST16, a standard interface module (such as an FIFO module) is generated for the sharable resource based on the information defined in Step ST15. Specifically, the path to be provided, the interface to be changed for and the destination of wrapper (described later) are determined in Step ST16.

In Step ST17, information about the sharable portion within each of the blocks, i.e., timing interface specifications, is defined and stored in the module specifications 1 shown in FIG. 1.

Figure 3:
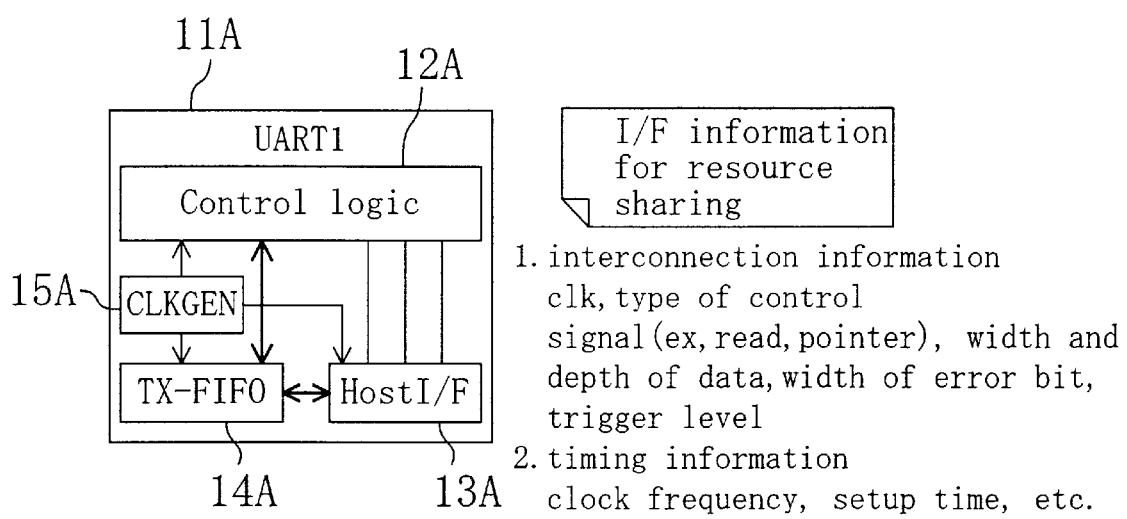
FIG. 3 is a block diagram illustrating the information added to a block to perform the step of sharing a resource in the process shown in FIG. 2.

FIG. 3 is a block diagram illustrating the information newly defined for a block to share the sharable resource in steps ST11 and ST17 shown in FIG. 2. In the illustrated example, the block 11A, which is the UART1 block, is used. The interface information defined to share a resource includes interconnection information and timing information. The interconnection information is defined about the width of a clock signal, the type of a control signal (i.e., whether Read or Pointer), the width and depth of data, the width of an error bit and a trigger level. The timing information is defined about a clock frequency and a setup time. In FIG. 3, the bold arrows indicate the flow of the interface information added to share the resource.

Then, in Step ST18, a wrapper is generated for connecting the portion, which has been extracted from each of the blocks, to the standard interface based on the data obtained in the processing steps ST13, ST16 and ST17.

Finally, in Step ST20, interconnection information about an optimized top-level hierarchy is generated based on the data obtained in the processing steps ST18, ST14 and ST16 and the interconnection information defined in Step ST19 about the top-level hierarchy.

By performing the process as shown in FIGS. 2 and 3, a sharable resource is extracted and a database, which is the interconnection information about the top-level hierarchy required for sharing the resource, is generated.

In this specification, the "top-level hierarchy" represents the overall system ranging from the lowest- to the highest-level layers, i.e., RT-level, architectural-level and specification-level layers. That is to say, the interconnection information about the top-level hierarchy is the information about the overall system interconnection at respective levels. According to this embodiment, by generating data at the specification level, the overall system performance can be estimated and an optimized database for individual blocks can be generated easily.

Figure 4:
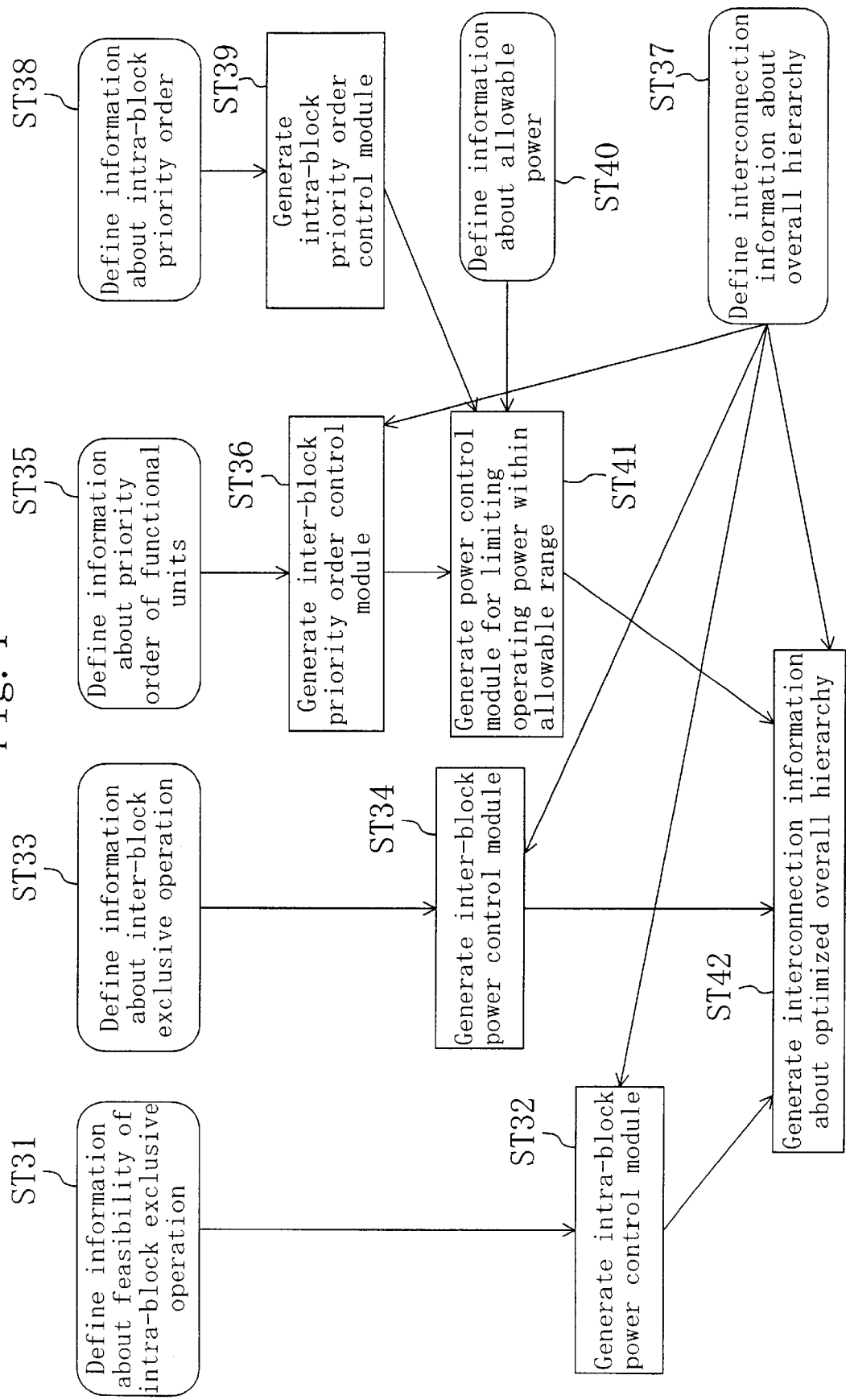
FIG. 4 is a flowchart illustrating a procedure of generating a power control and power management module according to the embodiment.

FIG. 4 is a flowchart illustrating a procedure of generating a power control and power management module (database).

In Step ST31, information about the feasibility of an exclusive operation within each of the blocks 11A through 11D (e.g., about changing transmitting and receiving) is defined. Next, in Step ST32, an intra-block power control module is generated based on the information about the exclusive operation as defined in Step ST31 and interconnection information about the top-level hierarchy as defined in Step ST37.

In Step ST33, information about an exclusive operation among the blocks 11A through 11D is defined. Next, in Step ST34, an inter-block power control module is generated based on the information about the exclusive operation as defined in Step ST33 and the interconnection information about the top-level hierarchy as defined in Step ST37. The power control module relates to turning OFF the power supplied to a block and suspending the supply of clock pulses.

In Step ST35, information about the order of priority applicable to respective functional units is defined to realize a sort of breaker function. For example, the power management function may be given the highest priority, the internal error management function the second highest priority and the external input acceptance function the third highest priority. In this manner, the respective functions are assigned an appropriate order of priority.

Next, in Step ST36, an inter-block priority order control module is generated based on the information about the priority order as defined in Step ST35 and the interconnection information about the top-level hierarchy as defined in Step ST37.

In Step ST38, information about the priority order with each block is defined. Then, in Step ST39, an intra-block priority order control module is generated based on the definition.

Subsequently, in Step ST41, a power control module for limiting the operating power within a allowable range is generated based on the inter- and intra-block priority order control modules generated in Steps ST36 and ST39, respectively, and information about the allowable power as defined in Step ST40. Examples of the information defined in Step ST40 include limiting power to less than 1 W because the reliability of the system LSI starts to deteriorate at 1 W or more due to heat generated.

Finally, in Step ST42, interconnection information about an optimized top-level hierarchy is generated based on the data obtained by the processing steps ST32, ST34 and ST41 and the interconnection information about the top-level hierarchy as defined in Step ST37.

Figure 5:
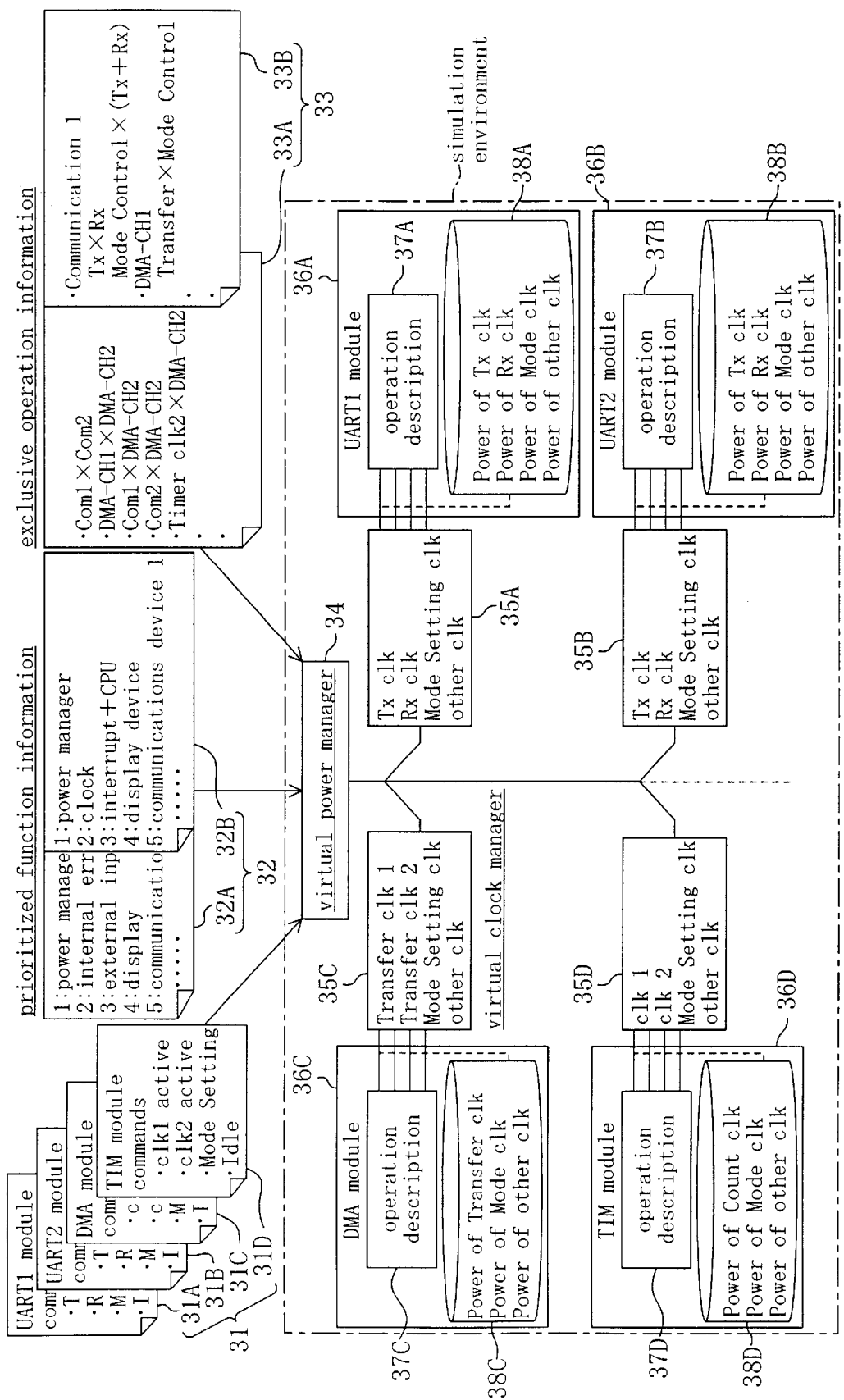
FIG. 5 illustrates the top-level hierarchy that has been generated for each block by the generator shown in FIG. 1 through the resource sharing and power management.

FIG. 5 illustrates the top-level hierarchy that has been generated within each block by the generator 4 shown in FIG. 1 through resource sharing and power management. As shown in FIG. 5, the information required for power management includes: verification data 31 for verifying a single block; prioritized function information 32; and exclusive operation information 33.

The verification data 31 includes first and second universal asynchronous receiver-transmitter (UART1 and 2) modules 31A and 31B, a direct memory access (DMA) module 31C and a timer (TIM) module 31D, which are used to verify the blocks 11A through 11D, respectively. Each of these modules includes various commands like transmission/reception, mode setting, idling, and operation with clock signal 1 or 2.

The prioritized function information 32 includes: a function portion 32A about power management, internal error management, external input acceptance, display, communication 1, etc.; and block portion 32B about circuits corresponding to these functions within a block, i.e., power manager, clock, interrupt and CPU, display device, communications device 1, etc.

The exclusive operation information 33 includes: a macro exclusion rule portion 33A describing exclusion rules as to a main routine operation or an inter-block operation; and a micro exclusion rule portion 33B describing exclusion rules as to a sub-routine operation or an inter-cell operation within a block. Examples of the macro exclusion rules include "communications devices 1 and 2 cannot operate in parallel", "DMA-CH1 and DMA-CH2 cannot operate in parallel", "communications device 1 and DMA-CH2 cannot operate in parallel" and "communications device 2 and DMA-CH2 cannot operate in parallel". Examples of the micro exclusion rules include "transmission and reception or mode control and transmission or reception cannot be performed in parallel during the operation of the communications device 1" and "transfer and mode control cannot be performed in parallel during the operation of DMA-CH1".

A simulation environment for use in the analysis of power dissipation as surrounded by the one-dot chain in FIG. 5 includes a virtual power manager 34 for performing power management. The simulation environment further includes: first and second universal asynchronous receiver-transmitter (UART1 and 2) modules 36A and 36B; a direct memory access (DMA) module 36C; a timer (TIM) module 36D; and virtual clock managers 35A through 35D for controlling the application of clock pulses to these modules 36A through 36D. These modules 36A through 36D are used for storing databases for designing the blocks 11A through 11D, respectively.

These modules 36A through 36D include: operation description sections 37A through 37D for storing, as databases, the operation descriptions for generating the respective blocks 11A through 11D; and power value storage sections 38A through 38D for storing pre-calculated power values of respective clock generators.

In doing simulations, the verification data 31, prioritized function information 32 and exclusive operation information 33 are input to the virtual power manager 34. In response thereto, the virtual power manager 34 performs respective processing steps corresponding to Steps ST34, ST36, ST39 and ST40 shown in FIG. 4. The output of the virtual power manager 34 is input to the virtual clock managers 35A through 35D, which perform respective processing steps corresponding to Steps ST32 through ST40 shown in FIG. 4.

For example, to optimize the operation description of the UART1 module 36A through power management, the commands stored in the UART1 module 31A included in the verification data 31 are input to the virtual power manager 34, the output of which is supplied to the virtual clock manager 35A. In response thereto, the virtual clock manager 35A passes clock signals of various types corresponding to the respective commands to the UART1 module 36A. At the same time, the power values of these clock signals are supplied from the power value storage section 38A, thereby selecting data to be stored in the operation description section 37A of the UART1 module 36A so as to minimize the power dissipated by respective clock operations. The other operation descriptions to be stored in respective operation description sections 37B through 37D of the UART2, DMA and TIM modules 36B through 36D are optimized in a similar manner in terms of power management. In this case, the prioritized function information 32 and exclusive operation information 33 are referred to, thereby managing the simulated operations responsive to the commands such that these operations are not contradictory to the contents of the information 32 and 33.

For example, when a command indicating which part of a block should operate is input to a module, information about the virtual power estimatingly dissipated by the operation of that part is supplied to the input end of the module. In addition, by reference to the power dissipation information prepared as a database for respective commands, it is possible to verify the information representing whether or not the power dissipation can be cut down. At the input ends of the respective operation description sections 37A through 37D, the wrappers (described in detail later) are generated.

In the foregoing example, simulated power management at the architectural level has been described with reference to FIG. 5. A similar simulation is naturally possible at the specification level or RT level.

Figure 6:
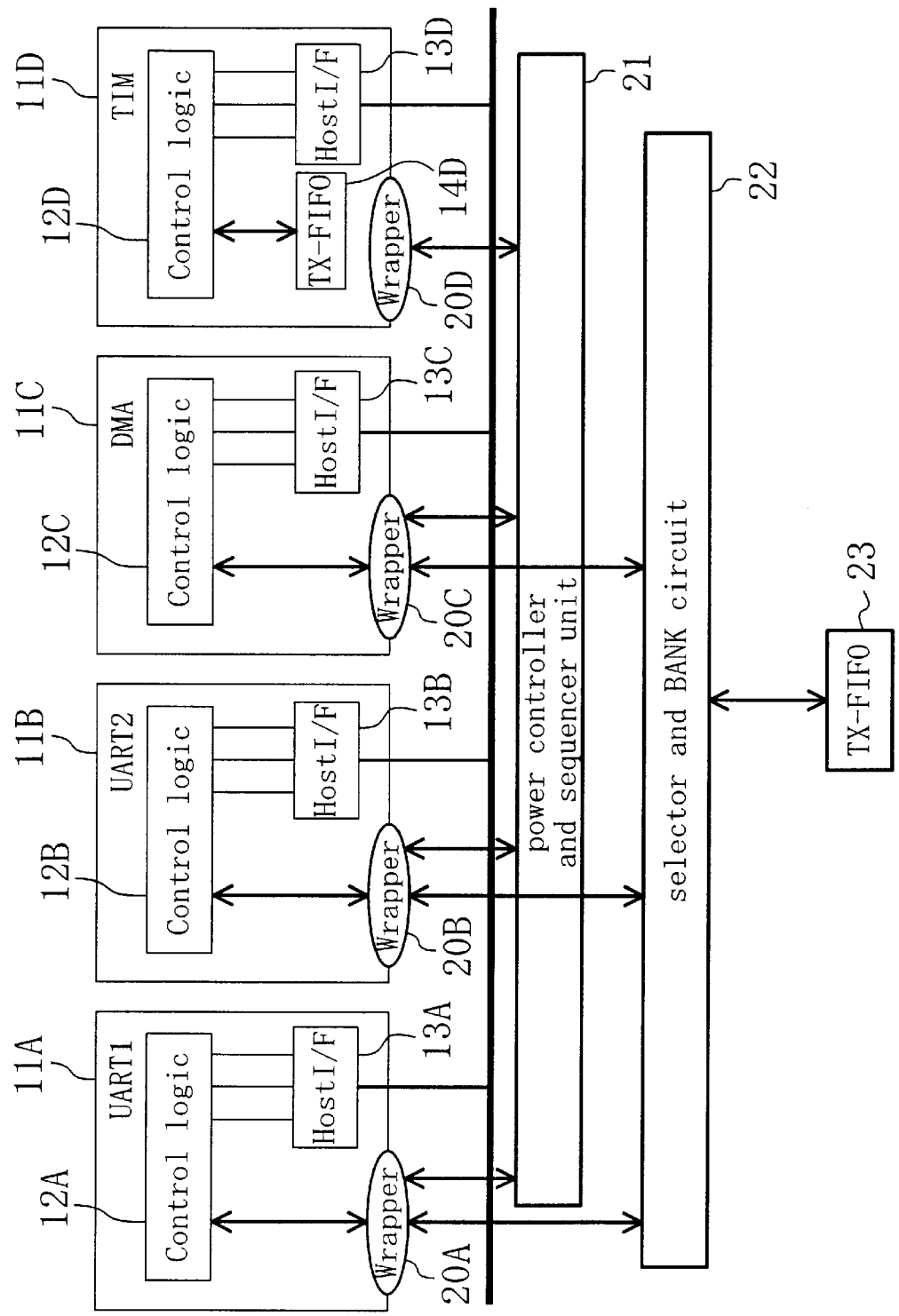
FIG. 6 is a block diagram illustrating an arrangement of a system LSI that has been optimized by the process according to the embodiment.

FIG. 6 is a block diagram illustrating an arrangement for a system LSI that has been optimized by the process shown in FIGS. 1 through 4. As shown in FIG. 6, blocks 11A through 11D include internal controllers 12A through 12D and interface circuits 13A through 13D, but do not include the FIFO memories 14A through 14C and clock generators 15A through 15D shown in FIG. 8. In these blocks 11A through 11D, wrappers 20A through 20D for enabling the coexistence of different bits, words and clock rates have been generated. It is noted that the block 11D includes: the FIFO memory 14D, which is a continuously operating section and could not be extracted as a sharable resource; and the wrapper 20D enabling just the coexistence of different clock rates.

In the conventional arrangement, if signals with mutually different bit widths or different clock rates are input to respective blocks 11A through 11D, then these blocks 11A through 11D cannot be connected together. Such an inconvenience, however, can be obviated by generating the wrappers 20A through 20D. For example, if the bit width of an external signal is 16 bits while that of an intra-block signal is 8 bits, then the signal input to the block may be fixed as the higher-order 8 bits thereof. Also, if signals are input at various clock rates, then a clock signal with the highest-common-factor rate may be supplied to the wrappers 20A through 20D. That is to say, each of these wrappers 20A through 20D functions as a sort of interface or adapter (also called a "bridge") for switching various buses into a common bus.

As shown in FIG. 6, this optimized system LSI also includes a power controller and sequencer 21 for controlling sequence of clock signals or power of clock generators based on the higher-level exclusive operation conditions. The system LSI further includes: a selector and bank circuit 22 for switching or controlling the banks in an FIFO memory based on the information about a sharable, exclusive portion; and a shared FIFO memory 23.

As is apparent from the foregoing description, the method for designing a system LSI according to the present invention can attain the following effects.

Firstly, the area occupied by a system LSI can be reduced by optimizing the top-level hierarchy interconnection information during a design process at the specification, architectural and RT levels, all of which are higher than the layout or logic synthesis level, such that a component is shared among respective blocks. That is to say, a semiconductor device implemented as a system LSI can have its size and weight both cut down.

Secondly, power consumed by a semiconductor device as a system LSI can be saved by performing power management during design process at the specification, architectural and RT levels, all of which are higher than the layout or logic synthesis level.

If exclusive operation information is utilized as well, the higher-order power estimation can be performed efficiently, or at a higher speed, and the power management is facilitated.

Furthermore, if inter-block or inter-cell prioritized information is also utilized, then it is possible to avoid the increase in power dissipation by preventing a plurality of sections from operating simultaneously.

Among other things, by designing respective block structures at the specification, architectural and RT levels, all of which are higher than the layout or logic synthesis level, the fixed application of functional blocks (i.e., intellectual property (IP)) can be broadened or a database, which is recyclable as a new "core", can be provided.

(Automated Design Procedure)

The design process according to the foregoing embodiment may be either performed manually or automated. However, the design process is preferably automated, because an LSI can be designed more efficiently in such a case. In particular, designing can be automated at the higher-levels, i.e., at the specification, architectural and RT levels, according to the present invention.

Figure 7:
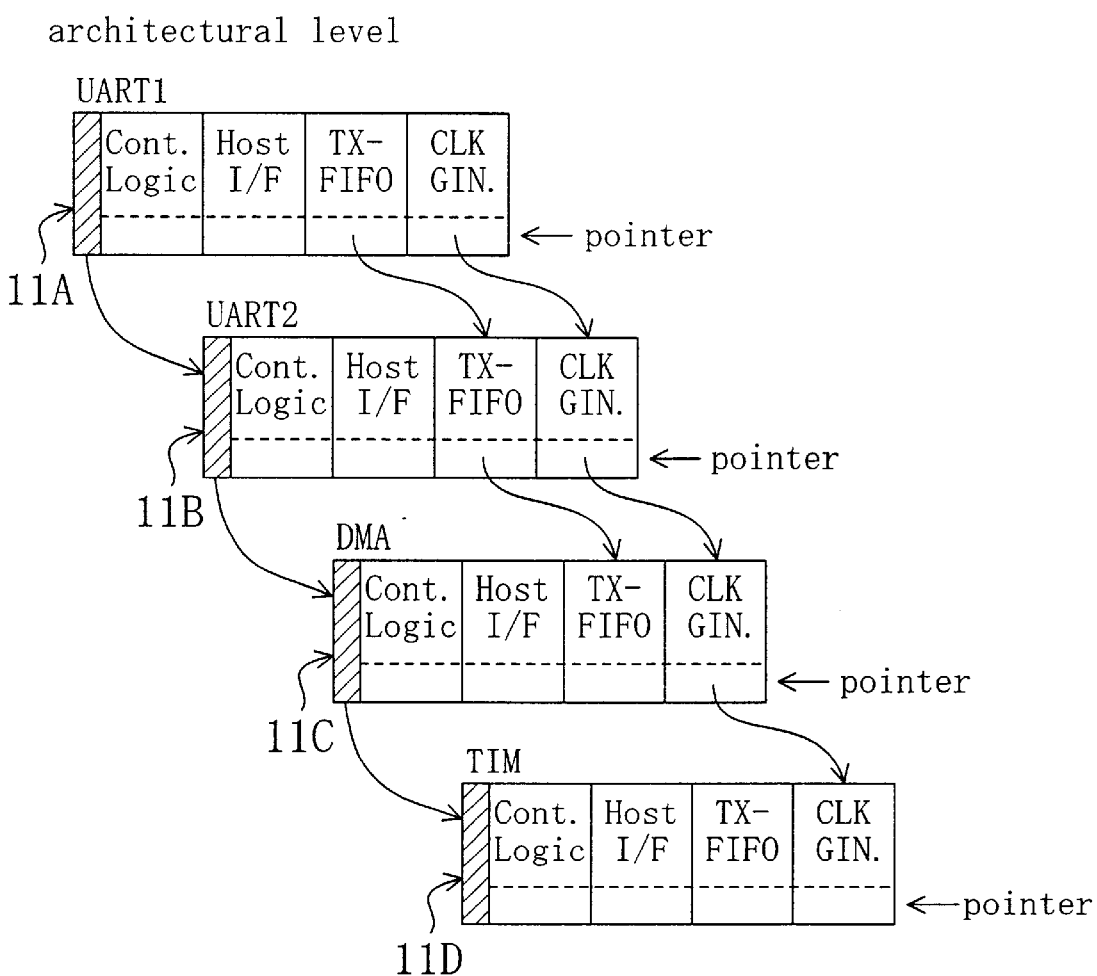
FIG. 7 illustrates an exemplary technique of automatically performing resource sharing at an architectural level according to the embodiment.

FIG. 7 illustrates an exemplary technique of automatically performing resource sharing at an architectural level by utilizing the data structures of the respective blocks 11A through 11D. As shown in FIG. 7, databases for the first and second universal asynchronous receiver-transmitter (UART1 and 2) blocks, a direct memory access (DMA) block and a timer (TIM) block corresponding to the blocks 11A through 11D, respectively, are provided. In this case, the data in each block has a pointer structure and sharable resources are connected to each other using these pointers. In the foregoing embodiment, the FIFO memories TX-FIFO may be shared among the blocks 11A through 11C and the clock generators CLKGEN may be shared among the blocks 11A through 11D. If these sharable portions of the data for respective blocks are sequentially specified using the pointers, then data for sharing can be generated automatically. In the illustrated example, an automation technique at the architectural level has been described. Alternatively, resource sharing can also be performed automatically by utilizing the data structure at the RT or specifications level as well.

What is claimed is:

1. A method for designing a semiconductor integrated circuit device including a plurality of functional blocks, each functional block containing a plurality of resources, the method comprising the steps of:

a) defining first information about exclusive and simultaneous operation among the functional blocks;

b) defining second information about a resource sharable within each functional block; and c) extracting a resource sharable among the functional blocks based on the first and second information.

2. The method of claim 1, further comprising the step of d) generating interconnection information about the resource sharable among the blocks after the step c) has been performed.

3. The method of claim 2, further comprising the step of defining timing information about the sharable resource within each said block before the step d) is performed, wherein in the step d), the timing information is used.

4. The method of claim 2, further comprising the step of e) generating interconnection information about an optimized top-level hierarchy based on the interconnection information about the resource sharable among the blocks and interconnection information about a top-level hierarchy that has been generated in advance.

5. The method of claim 2, further comprising, before the step d) is performed, the steps of:

defining a standard interface for the sharable resource; and generating information about the standard interface for the sharable resource, wherein in the step d), the standard interface information is used.

6. A method for designing a semiconductor integrated circuit device including a plurality of blocks and a resource shared among the blocks, each said block including a plurality of cells, the method comprising the steps of:

a) defining exclusive operation information among the blocks; and b) generating a signal switching control for the resource shared among the blocks based on the exclusive operation information.

7. The method of claim 6, further comprising the step c) of defining interconnection information about a top-level hierarchy and generating interconnection information about an optimized top-level hierarchy after the step b) has been performed.

8. A method for designing a semiconductor integrated circuit device including a plurality of blocks, each including a plurality of cells, the method comprising the steps of:

a) defining exclusive operation information as to each functional unit within each said block;

b) defining interconnection information about a top-level hierarchy; and c) generating a power management for each said block based on the exclusive operation information and the interconnection information about the top-level hierarchy.

9. The method of claim 8, further comprising the step d) of generating interconnection information about an optimized top-level hierarchy based on the interconnection information about the top-level hierarchy and the power management after the step c) has been performed.

10. A method for designing a semiconductor integrated circuit device including a plurality of blocks, each including a plurality of cells, the method comprising the steps of:

a) defining exclusive operation information among the blocks;

b) defining interconnection information about a top-level hierarchy; and c) generating a power management among the blocks based on the exclusive operation information and the interconnection information about the top-level hierarchy.

11. The method of claim 10, further comprising the step d) of generating interconnection information about an optimized top-level hierarchy based on the interconnection information about the top-level hierarchy and the power management after the step c) has been performed.

* * * * *

UNITED STATES PATENT AND TRADEMARK OFFICE
CERTIFICATE OF CORRECTION

PATENT NO.   : 6,415,416 B1
DATED        : July 2, 2002
INVENTOR(S)  : Makoto Fujiwara et al.

It is certified that error appears in the above-identified patent and that said Letters Patent is hereby corrected as shown below:

<u>Title page,</u>
Item [56], "References Cited, U.S. PATENT DOCUMENTS, add
--    5,557,531    09/1996    Rostoker, et al.    716/2
     5,867,400    02/1999    El-Ghoroury, et al.    716/8
     4,896,272    01/1990    Kurosawa    716/1
     5,831,864    11/1998    Raghunathan, et al.    716/1 --

Signed and Sealed this

Eleventh Day of February, 2003

JAMES E. ROGAN
*Director of the United States Patent and Trademark Office*